United States Patent [19]
Stupian et al.

[11] Patent Number: 5,543,364
[45] Date of Patent: Aug. 6, 1996

[54] HYDROGEN OUT VENTING ELECTRONIC PACKAGE

[75] Inventors: Gary W. Stupian, Hermosa Beach; Martin S. Leung, Redondo Beach, both of Calif.

[73] Assignee: The Aerospace Corporation, El Segundo, Calif.

[21] Appl. No.: 359,970

[22] Filed: Dec. 20, 1994

Related U.S. Application Data

[62] Division of Ser. No. 324,070, Oct. 14, 1994.

[51] Int. Cl.$^6$ ................................................. H01L 21/60
[52] U.S. Cl. ................ 437/210; 437/209; 437/215; 437/217; 437/220; 437/221
[58] Field of Search ................................. 437/210, 209, 437/215, 216, 217, 218, 219, 220, 221, 222, 223, 224; 257/680, 682, 683, 704, 710, 729, 769

[56] References Cited

U.S. PATENT DOCUMENTS

| | | | |
|---|---|---|---|
| 4,382,327 | 5/1983 | Bardens et al. | 437/210 |
| 4,426,769 | 1/1984 | Grabbe | 437/210 |
| 4,769,272 | 9/1988 | Byrne et al. | 437/217 |
| 4,769,345 | 9/1988 | Butt et al. | 437/217 |
| 5,020,065 | 5/1991 | Tada | 257/680 |
| 5,022,930 | 6/1991 | Ackerman et al. | 437/210 |
| 5,156,999 | 10/1992 | Lee | 437/215 |
| 5,231,036 | 7/1993 | Miyauchi et al. | 437/218 |

*Primary Examiner*—Kevin M. Picardat
*Attorney, Agent, or Firm*—Derrick M. Reid

[57] ABSTRACT

A hydrogen out venting window is disposed on or in a hermetically sealed electronic package lid, the window including a catalyst which dissociates internally trapped molecular hydrogen at an interior surface of the catalyst into atomic hydrogen and which recombines the atomic hydrogen back into molecular hydrogen at an exterior surface of the catalyst with the atomic hydrogen diffusing from the interior surface to the exterior surface to vent out the molecular hydrogen from the interior of the package to the exterior of the package, the window taking various forms including a catalyst sandwich with the package lid disposed between an interior catalysis plate and an exterior catalysis plate, a plate window with a catalysis covering plate disposed over a hole in the package lid, a plug window having a catalysis plug disposed in a hole in the package lid, or a lid window where the package lid is the catalyst, the catalyst being a suitable transition metal such as palladium or platinum, or alloy, disposed on or in or as the electronic package lid.

10 Claims, 3 Drawing Sheets

HYDROGEN OUT VENTING ELECTRONIC PACKAGE

STATEMENT OF GOVERNMENT INTEREST

The invention was made with Government support under Contract No. F04701-C-0089 awarded by the Department of the Air Force. The Government has certain rights in the invention.

REFERENCE TO RELATED APPLICATIONS

The present application is a division of prior co-pending application Ser. No. 08/324,070, filed Oct. 14, 1994, for Hydrogen Out Venting Electronic Package"by inventors Stupian et al."

BACKGROUND OF THE INVENTION

The presence of hydrogen in the cavity volume inside an electronic package, such as an integrated circuit package, is known to cause significant degradation of some type of semiconductor devices. For example, high frequency gallium arsenide (GaAs) Schottky field effect transistors (FETs) incorporating Schottky metal gates upon channels are susceptible to hydrogen impurities. While the channel of the gate could otherwise be marginally protected by a good insulating dielectric layer, the GaAs processes do not enable good insulating layer formation for making suitable FETs. This is unlike silicon process based FETs which can have good silicon oxide insulators grown as a gate to channel dielectric insulating layer. A good oxide gate dielectric insulator is desired so that when a gate voltage is applied, gate electrons do not flow into the channel from the gate. Insulating layers can also partially protect the channel from contamination. The chemical binary nature of Group III-V materials, e.g. GaAs, do not form good oxide layers for insulating purposes and are thus not well suited for dielectric layer formation within a FET structure. Germanium is a good semiconductor material with a higher electron mobility than the GaAs materials, but germanium oxide is hygroscopic and not well suited as insulating layers. GaAs may be used to form a gallium oxide layer but the presence of arsenic degrades the effectiveness of the gallium oxide insulating layer. Prior unsuccessful efforts have been directed to finding a suitable GaAs based insulator to prevent contamination of the channel while providing a suitable gate dielectric. Gallium oxide is not used as a FET gate dielectric. The GaAs FETs have used Schottky metal gates deposited directly on the GaAs channel. The Schottky junction is asymmetric between the GaAs channel and the metal gate and such FET devices have been in use for some time. However, the Schottky gate can communicate diffused hydrogen and impurities directly into the channel to thereby contaminate the channel.

Prior efforts have been directed towards eliminating unwanted hydrogen from electronic packages containing Schottky Gate GaAs FETs as well as many other electronic devices. The Schottky barrier forms a junction at the semiconductor and the metal layer interface. It is desirable to create stable surface structures in semiconductor devices including the GaAs Schottky gate-channel interface. The surface of the GaAs channel is not a consistent lattice structure and is characterized by gallium and arsenic sites. Certain metals are known to bond well and permanently to such irregular GaAs surface sites. For example, titanium and aluminum are known to bond well to the surface of the irregular GaAs FET channel. It is also desirable that the gate be connected to a highly conductive metal, such as gold or silver. Thus, a GaAs FET metal Schottky gate preferably consists of one or more metal layers, including a contact metal such as titanium or aluminum, and barrier metal, such as palladium or platinum, and a conduction metal, such as gold or silver. Several Schottky metal gate contact schemes have been used. When using a GaAs semiconductor, for example, a bottom bonding titanium metal layer is used as the Schottky contact metal, which is covered by a middle platinum barrier layer, which is covered by a top gold conduction layer. The platinum is used to prevent gold from diffusing into and through the titanium layer, as is well known. The problem with the use of such metal systems is the interaction of transition metals with hydrogen trapped in the electronic package. These transition metals, such as palladium and platinum, are known to interact with molecular hydrogen. These transition metals convert, at their surface, molecular hydrogen into atomic hydrogen which may then diffuse through the metal. Thus, a palladium or platinum metal barrier layer may collect hydrogen which then may disadvantageously diffuse through the barrier layer and through the contact metal, such as titanium, to the FET gate-channel boundary and as well as disadvantageously diffusing into the GaAs channel itself. A gold or silver conducting layer covering the barrier layer may seem to provide some protection from the collection and diffusion of hydrogen into the barrier layer, but the conducting layer does not completely cover the barrier layer particularly at the edges providing access of hydrogen to the barrier and contact layers as well as the junction and channel.

Hydrogen will diffuse into the metal gate-channel junction boundary or into the GaAs channel. It is believed that diffused atomic hydrogen causes unwanted electronic dipoles at the gate-channel Schottky junction to affect energy levels, or causes neutralization of dopant centers within the channel. For example, the affects are believed to cause as much as a forty percent reduction in drain to source current in a five percent hydrogen gas. The diffusion of atomic hydrogen, and to a lesser extent the diffusion of molecular hydrogen, degrades the gain and increases noise of GaAs FETs. Additionally, the hydrogen collection and diffusion process occurs over time to degrade the electronic performance of the GaAs FET over time, well after the initial fabrication of the FET. The presence of molecular hydrogen within the package continuously degrades the performance of the GaAs FETs. Thus, much effort has been expended to reduce gaseous molecular hydrogen within electronic semiconductor packages to prevent initial, continuous and long term degradation of the GaAs FET as well as other electronic devices.

Hermetic sealing of an electronic package is used to prevent contamination from unwanted materials such as organic materials, water, hydrocarbons, and ionic species. The sealing of an electronic package containing integrated circuits in an ultra pure inert gases does not eliminate the formation of hydrogen therein because of the materials often used in the package, including the electronic devices, evolve molecular hydrogen over time after package sealing. For example, nickel or silver electronic package plating materials, or for another example, microwave absorbing materials often contain traces of hydrogen which evolve over time into gaseous molecular hydrogen trapped within the electronic package and available for diffusion into integrated circuit semiconductor devices to potentially degrade integrated circuit performance over time.

Steps have been taken to eliminate the amount of trace hydrogen from the semiconductor materials prior to and during processing. However, all metals contain trace amounts of hydrogen. So even in the cleanest environments, hydrogen is still present in small impurity concentrations. Vacuum deposition processes of metals using very low vapor pressures, electrolysis deposition, pre-bake processes and ultra clean air environments will not eliminate the presence of hydrogen. Trace hydrogen will always be present in the manufacture of electronic devices. Therefore, there exists a need to create a means which will over time vent out unwanted molecular hydrogen from the internal cavity of electronic packages containing electronic and semiconductor devices, yet will also allow hermetic sealing of the packages.

Some laboratory apparatus have used catalytic metals such as palladium, to purify hydrogen gas using surface catalytic dissociation and recombination of molecular hydrogen. Such an apparatus has not been adapted to collect hydrogen within electronic packages. Some approaches have used hydrogen gettering materials within an electronic package to absorb internally trapped molecular hydrogen, but this approach does not eliminate the hydrogen but acts to capture the unwanted hydrogen. The absorbing gettering materials have absorption limits, may not completely absorb all of the trapped hydrogen and will evolve some trace hydrogen over time. These approaches have proven to be costly and ineffective in eliminating the presence of hydrogen within an electronic package. It is practically impossible to eliminate all trace elements of hydrogen.

Another approach applied in space exploration vehicles has been the use of out venting holes drilled or formed into the electronic packages so that the hydrogen within an electronic package will vent out over a period of time into the lower pressure of outer space once the electronic packages are placed in orbit. The problem with this approach is that the electronic devices are subject to contamination during terrestrial fabrication and prelaunch activities even with some marginal benefits of out venting of hydrogen to ambient air. However, the use of a hole in the package disadvantageously prevent hermetic sealing and enables the contamination of the internal circuits by unwanted materials.

Thus, there continues to exist a need to remove hydrogen from electronic packages even with advanced sealing and material purification techniques. The problem of sealing an electronic package to prevent contamination while enabling out venting of hydrogen has not been solved. The continued presence of hydrogen in electronic packages continues to disadvantageously degrade integrated circuit performance over time. These and other disadvantages of unwanted trapped hydrogen are solved or reduced using the present invention.

SUMMARY OF THE INVENTION

An object of the present invention is to reduce the presence of hydrogen within small packages.

Another object of the present invention is to reduce the amount of hydrogen within electronic semiconductor packages by out venting internally trapped hydrogen.

Another object of the present invention is to vent out hydrogen through a hydrogen out venting window disposed in an electronic package which remains sealed to provide a barrier to other contaminants.

The invention vents out molecular hydrogen from the internal cavity of electronic packages using a hydrogen catalytic and hydrogen permeable window formed in or on the wall of the packages. The hydrogen out venting window is formed of a material which is permeable to diffusing atomic hydrogen. The material is also catalytic at its internal and external surfaces to convert gaseous molecular hydrogen to and from diffusing atomic hydrogen which diffuses through the window. The interior surface catalytically dissociates molecular hydrogen into atomic hydrogen while the exterior surface catalytically recombines atomic hydrogen back into molecular hydrogen. The catalytic material does not dissociate water molecules thereby enabling the material to function as part of a hermetic seal. Catalytic activity of the hydrogen window is determined by available d-electron orbitals of the surface atoms of the catalytic window material, such as palladium and platinum. Outer space and terrestrial ambient air serve as low partial hydrogen pressures to vent out the internally trapped hydrogen from the interior of the packages to the exterior space of the packages. The hydrogen out venting occurs whenever the interior hydrogen partial gas pressure is greater than the exterior hydrogen partial gas pressure, as may be in the case in ambient air or outer space.

The hydrogen out venting window may take one of many forms. For example, the hydrogen window may take the form of a plug in a window hole in the wall of the package. For another example, the hydrogen window may take the form of covering plate over a package window hole. For yet another example, the hydrogen window may also take the form of a sandwich window including an interior plate positioned under an exterior plate between which is sandwiched a window portion of the wall of the package through all of which the atomic hydrogen then diffuses for out venting. In yet another form, the window may simply be a package lid. In each of these forms, the catalytic material disassociates molecular hydrogen on an interior surface from which the atomic hydrogen diffuses through the window to the exterior outer surface where the atomic hydrogen catalytically recombines back into to molecular hydrogen and there vents out into ambient air or outer space. The hydrogen window enables the sealing the interior cavity of the package to prevent contamination while also out venting hydrogen initially captured within the electronic package. These and other advantages will become more apparent from the following detailed description of the preferred embodiment.

DETAILED DESCRIPTION OF THE PREFERRED EMBODIMENT

Figure 1:
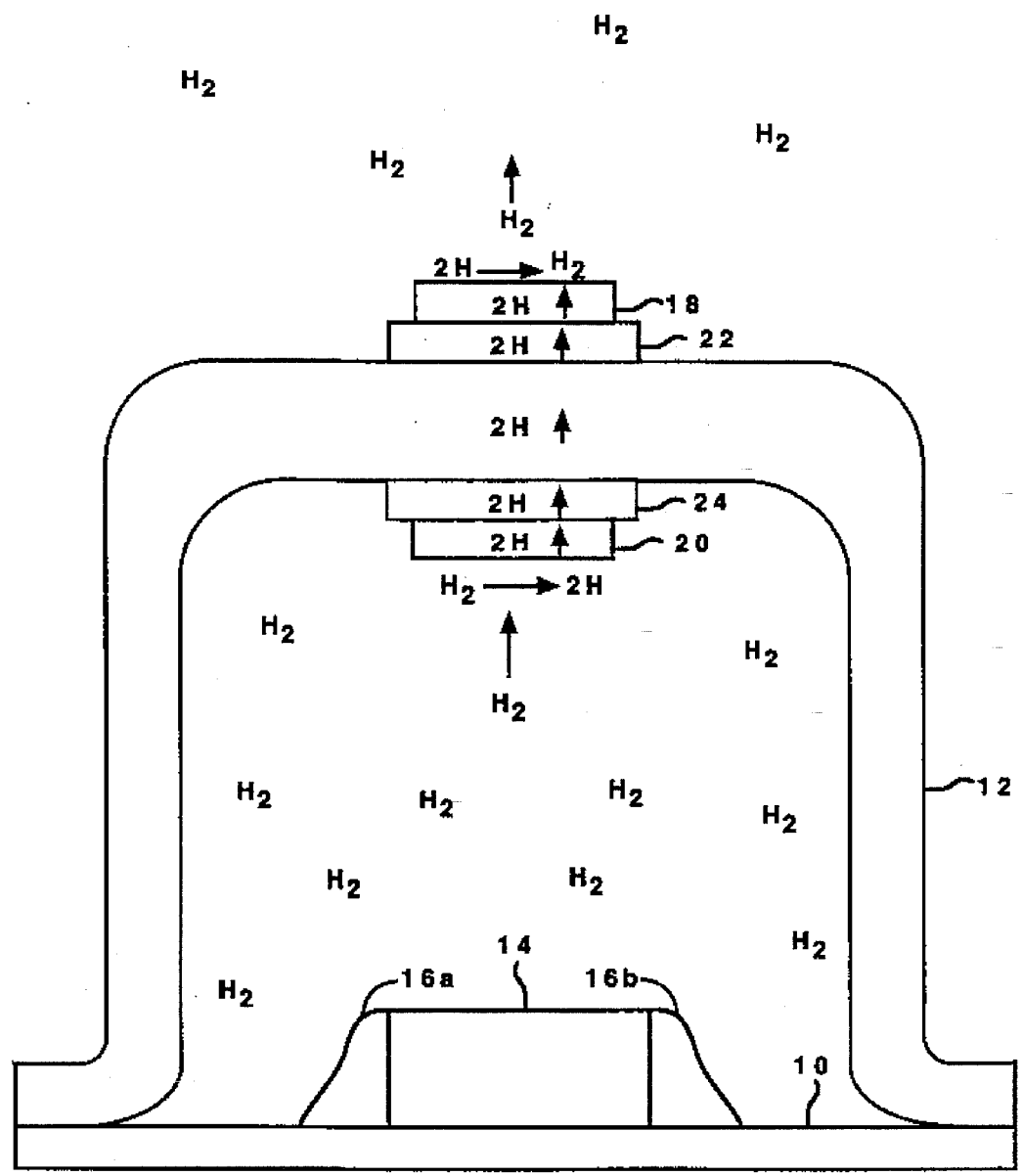
FIG. 1 is a diagram of an electronic package having a sandwich hydrogen window.

Referring to all of the Figures, an electronic package has a bottom portion 10 and an lid portion 12. On the bottom package portion 10 is disposed one or more semiconductor devices such an integrated circuit 14. The circuit 14 is bonded to the bottom package portion 10 by a bonding material 16a and 16b. The package portions 10 and 12, the circuit 14 and the bonding material 16 may evolve molecular hydrogen into the internal cavity of the package as defined by package portions 10 and 12. The package portions 10 and 12 serve to trap molecular hydrogen within the package which is typically hermetically sealed. The lid 12 may be a hermetically sealed lid made of a metal, metal alloy or ceramic material. The seal between the lid 12 and bottom 10 may be made by a glue or brazing material, not shown, which may also evolve molecular hydrogen. The circuit 14, bonding material 16, and package portions 10 and 12 may evolve unwanted molecular hydrogen into the cavity of the package over a long period of time creating a continuous hydrogen partial pressure within the package portions 10 and 12. In the normal situations, the internally evolved hydrogen partial pressure is more than an external hydrogen partial pressure.

Referring to FIG. 1, the electronic package lid 12 includes a sandwich hydrogen window having a top sandwich plate 18 disposed on the outer surface of the lid 12, and having a bottom sandwich plate 20 disposed on an inner surface of lid 12. Any surface of the package portion 10 and 12 may serve to support the plates 18 and 20 generally disposed in alignment with each other. The top window plate 18 is preferably disposed on an adherence layer 22 and the bottom sandwich plate 20 on a bottom adherence layer 24. The interior surface of the bottom plate 20 acts to catalytically disassociate internally trapped molecular hydrogen into atomic hydrogen which diffuses outward through the bottom plate 20, through the bottom adherence layer 24, through package lid 12 towards and through the adherence layers 22, and then through the top plate 18 which then recombines the atomic hydrogen back into molecular hydrogen at an exterior surface of the top plate 18 completing the out venting the hydrogen to the external space. The out venting of the hydrogen functions as long as the exterior hydrogen gas partial pressure is lower than the interior hydrogen gas partial pressure as is common in ambient air or outer space. As long as the hydrogen partial pressure outside the package is very low, the hydrogen window will continue to pump the molecular hydrogen generated and trapped inside the package to the outside space.

The diffusion of the hydrogen through the sandwich window enables out venting. The catalytic plate 20 dissociates at the interior surface hydrogen molecules into atomic hydrogen and the catalytic plate 18 recombines the atomic hydrogen back into molecule hydrogen at the exterior surface. The atomic hydrogen diffuses rapidly through the plates 18 and 20 and the lid 12 to vent out the molecular hydrogen. The package lid 12 may be made of a metal, a metal alloy or a ceramic all of which are capable of diffusing atomic hydrogen. The plates 20 and 18 may be any catalytic material, and preferably a transition metal, such as palladium or platinum, which can disassociate molecular hydrogen and recombine atomic hydrogen at exposed surfaces. Catalytic alloys, such as palladium silver and palladium nickel alloys, as well as like platinum alloys can be used to catalytically dissociate and recombine surface molecular hydrogen. The catalyst may be disposed on the package by sputtering or other conventional evaporation, vacuum or electrolytic plating deposition processes.

The preferred adherence layers 22 and 24 provide for adhesion between the plates 18 and 20 and the lid 12. With the use of a ceramic, such as alumina $Al_2O_3$ or a metal alloy as the package lid 12, a chromium or a palladium silicon alloy may be used as the adherence material of layers 22 and 24. Where the lid 12 is a metal, the adhesion layers 22 and 24 may not be necessary as the plates 20 and 22 may adhere well to the lid 12 using baking processes. A brazing material, not shown, may also be used to provide good adherence at the surfaces of the adherence layers 22 and 24, the plates 18 and 20, or the lid 12.

Figure 2:
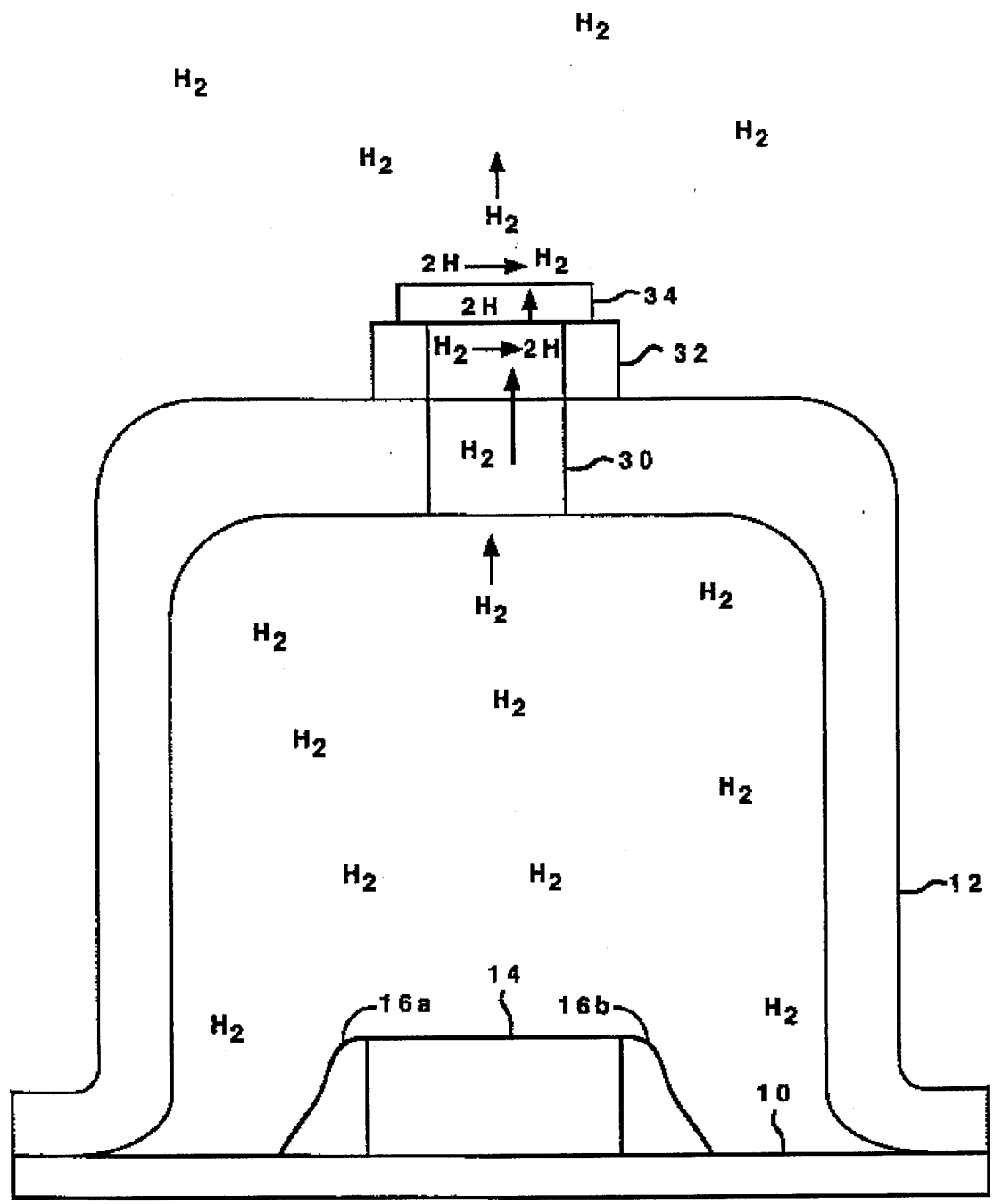
FIG. 2 is a diagram of an electronic package having a plate hydrogen window.

Referring to FIG. 2, the electronic package lid 12 has a plate hydrogen window comprising a hole or aperture 30 which extends through the lid 12 and through an adhesion layer 32 and comprising a covering plate 34. The adhesion layer 32 serves to adhere the plate 34 to the lid 12 while passing molecular hydrogen through the hole 30 also extending through the adhesion layer 32. In one form of the invention, the hole 30 serves to communicate internally trapped molecular hydrogen to the internal surface of the plate 34 whereat the plate 34 dissociates the molecular hydrogen into atomic hydrogen. The dissociated atomic hydrogen then diffuses through the plate 34 to the outer surface of the plate 34 to recombine the atomic hydrogen at that exterior plate surface back into molecular hydrogen for out venting. The adhesion layer 32 may be preformed plates and bonded to the package lid 12 by thermal baking using a brazing material, not shown. The plate 34 may also be a preformed plate bonded by thermal baking to the adherence layer 32 also using a brazing material, not shown. In another form of the invention, the plate 34 and adhesion layer 32 are disposed on the internal surface of the lid 12 but still covering the aperture 30 then serving to communicate recombined hydrogen to the external space.

Figure 3:
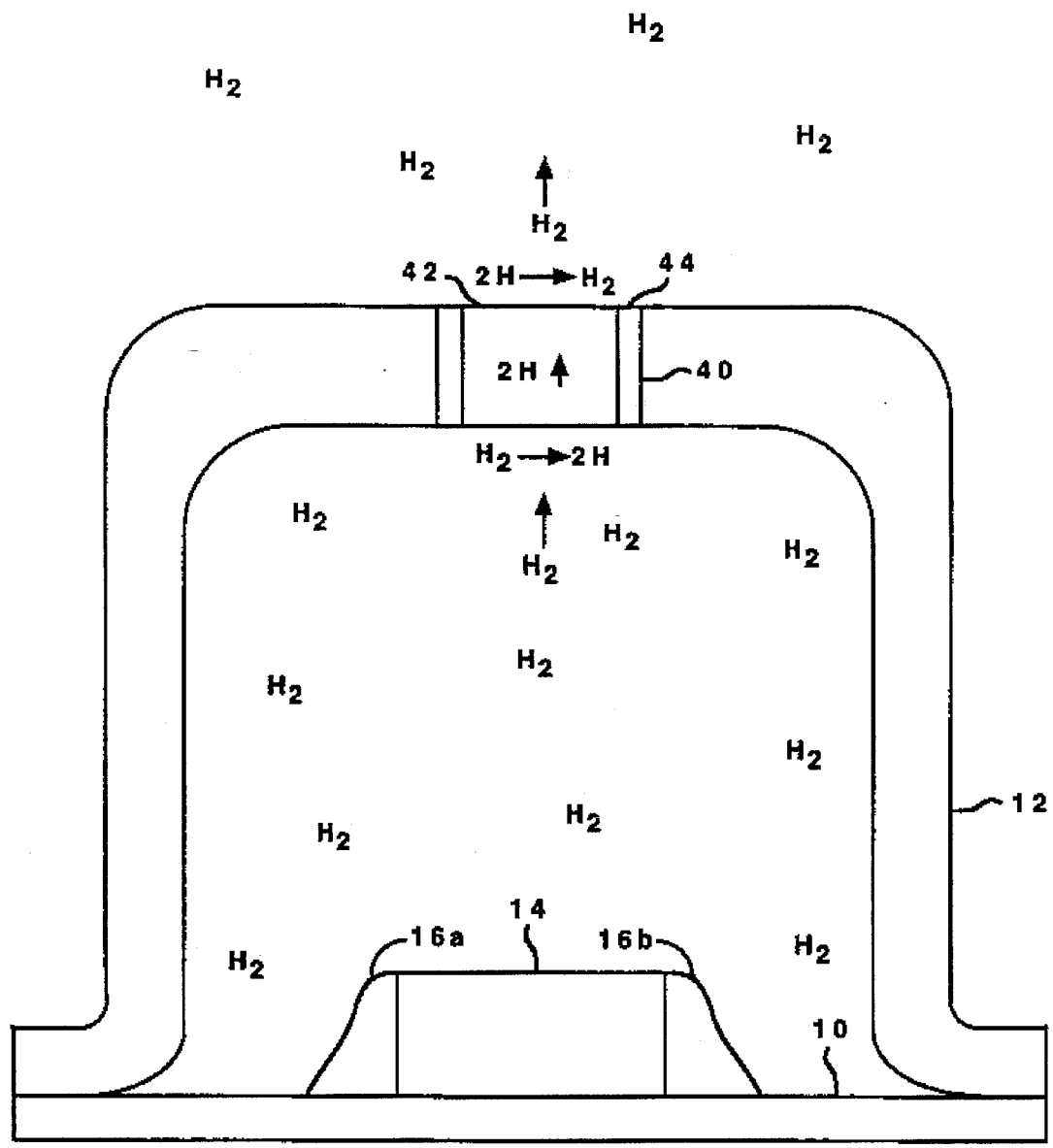
FIG. 3 is a diagram of an electronic package having a plug hydrogen window.

Referring to FIG. 3, the electronic package lid 12 has a plug hydrogen window comprising a hole or aperture 40 in which is disposed a catalytic cylindrical plug 42, and an adhesion ring 44 which surrounds the plug 42 and covers the interior wall of the hole 40. The adhesion ring 44 serves to adhere the plug 42 within the hole 40 of the lid 12. The adhesion ring 44 may be preformed and mechanically inserted or pressed into the hole 40 and preferably baked for improved adherence. The plug 42 may also be preformed and mechanically inserted or pressed into the ring 44 and then also preferably baked. The plug 42 serves to vent out internally trapped molecular hydrogen. The plug 42 catalytically dissociates internally trapped molecular hydrogen at the internal surface of the plug 42. The dissociated hydrogen diffuses through the plug 42 towards the outer surface of the plug 42 whereat the atomic hydrogen then recombines back into molecular hydrogen for out venting.

The above preferred embodiments include a hydrogen window which catalytically dissociates internally trapped hydrogen into molecular hydrogen which diffuses through the window and recombines back into molecular hydrogen at the outer surface of the hydrogen window for out venting. The disclosed embodiments may be modified and enhanced by those skilled in the art selecting various different materials and arrangements. For example, the lid 12 may itself be made of a hydrogen catalytic material, while remaining portion of the package is not, and thus the entire lid 12 serves as the hydrogen out venting window. For another example, the plate 34 may be disposed on the interior surface of the lid 12 covering the aperture 30 without the use of an adhesion layer 32. Those modifications and enhancements may nonetheless fall within the spirit and scope of the following claims.

What is claimed is:

1. A method of forming a package out venting molecular hydrogen from an interior cavity of said package to the exterior space of said package, said package having at least two portions, said method comprising the steps of, bonding an electronic device using a bonding material to a package interior surface of said package, disposing a hydrogen catalyst on one of said at least two portions of said package, said catalyst for dissociating molecular hydrogen trapped within said cavity into atomic hydrogen at a catalyst interior surface of the said catalyst exposed to said cavity of said package, for diffusing said atomic hydrogen through said hydrogen catalyst, and for recombining the diffused atomic hydrogen at a catalyst exterior surface of said hydrogen catalyst for out venting said molecular hydrogen into said exterior space, and sealing said at least two portions together for encapsulating said electronic device within said package.

2. The method of claim 1 wherein said sealing step is a hermetically sealing step, said package then being hermetically sealed and tending to trap said molecular hydrogen in said cavity and tending to vent out said trapped molecular hydrogen within said cavity through said hydrogen catalyst to said exterior space of said package, said hermetically sealing step preventing water molecules from ambient air in said exterior space from entering into said cavity.

3. The method of claim 1 wherein said disposing step comprises the steps of, disposing an interior catalysis layer on said package interior surface of said package, said interior catalysis layer having said catalyst interior surface for dissociating molecular hydrogen into atomic hydrogen; and, disposing an exterior catalysis layer on a package exterior surface of said package in alignment with said interior catalysis layer, said exterior catalysis layer having said catalyst exterior surface, said atomic hydrogen diffusing from said catalyst interior surface of said interior catalysis layer towards said catalyst exterior surface of said exterior catalysis layer there recombining said atomic hydrogen back into molecular hydrogen for out venting.

4. The method of claim 1 wherein said method further comprises the step of, forming an aperture in one of said at least two portions of said package, said aperture for receiving said hydrogen catalyst disposed in and plugging said aperture, said hydrogen catalyst having said catalyst interior surface for dissociating internally trapped molecular hydrogen into atomic hydrogen diffusing through said hydrogen catalyst towards said catalyst exterior surface of said hydrogen catalyst there recombining said atomic hydrogen back into molecular hydrogen for out venting into said exterior space.

5. The method of claim 1 wherein said method further comprises the step of, forming an aperture in one of said at least two portions of said package, said hydrogen catalyst dispose as a plate covering said aperture, said hydrogen catalyst having said catalyst interior surface for dissociating internally trapped molecular hydrogen into atomic hydrogen diffusing through said hydrogen catalyst towards said catalyst exterior surface of said hydrogen catalyst there recombining said atomic hydrogen back into molecular hydrogen for out venting into said exterior space.

6. The method of claim 4 further comprising the step of, depositing an adhesion layer within said aperture, said adhesion layer for receiving said hydrogen catalyst in the form of a palladium plug.

7. The method of claim 5 wherein said method further comprises the step of, depositing an adhesion layer having an adhesion layer aperture in alignment with said aperture, said adhesion layer for bonding said hydrogen catalyst to cover said aperture and said adhesion layer aperture.

8. The method of claim 5 wherein said hydrogen catalyst is a plate of palladium deposited on a package exterior surface of said one of said at least two portions of said package and positioned to cover said aperture.

9. The method of claim 5 wherein said hydrogen catalyst is a plate of platinum deposited on said package interior surface and positioned to cover said aperture.

10. The method of claim 8 further comprising the step of, depositing an adhesion layer of palladium silicon having an adhesion layer aperture in alignment with said aperture and disposed on said interior package surface, said adhesion layer for bonding said hydrogen catalyst made of palladium positioned under said aperture.

* * * * *